United States Patent [19]

Kalanit

[11] 4,037,153
[45] July 19, 1977

[54] DIGITAL METERS

[75] Inventor: Gideon Kalanit, New Malden, England

[73] Assignee: Communications Patents Limited, London, England

[21] Appl. No.: 637,054

[22] Filed: Dec. 2, 1975

[30] Foreign Application Priority Data

Dec. 3, 1974 United Kingdom ............... 52174/74

[51] Int. Cl.² ...................... G01R 19/00; G01R 19/16
[52] U.S. Cl. ..................................... 324/122; 324/96; 324/133
[58] Field of Search ................ 324/96, 122, 99 D, 133

[56] References Cited

U.S. PATENT DOCUMENTS

| 2,486,890 | 11/1949 | Stanmyre | 324/103 R |
| 3,796,951 | 3/1974 | Joseph | 324/122 |

Primary Examiner—Rudolph V. Rolinec
Assistant Examiner—Ernest F. Karlsen
Attorney, Agent, or Firm—Laurence R. Brown

[57] ABSTRACT

A meter for presenting a digital display representative of an analogue input signal is disclosed in which series connected control circuits are arranged to draw current from a first constant current source, a second constant current source is connected to a respective switch in each control circuit so that when the switch is closed a current may flow from the second source to a respective control circuit, and display means such as light emitting diodes are provided for indicating the control circuit or circuits to which a predetermined current flows from the second source. The analogue input signal is applied to each control circuit to determine which of the control circuit switches is closed to enable current to flow thereto from the second source.

11 Claims, 7 Drawing Figures

DIGITAL METERS

The present invention relates to digital meters, and in particular to meters which provide a digital display, for example a moving dot display representative of an analogue input signal.

Previously known digital meters have generally included a clock and have been dependent upon a time interval or time cycle to make a measurement. It is an object of the present invention to provide a digital meter which does not include a clock or timing circuits and can as a result be more easily made than known meters.

The present invention provides a meter for presenting a digital display representative of an analogue input signal, the meter comprising a first constant current source, a plurality of series connected control circuits arranged to draw current from the first source, a second constant current source connected to a respective switch in each control circuit so that when the switch is closed a current may flow from the second source to a respective control circuit, and display means for indicating the control circuit or circuits to which a predetermined current flows from the second source, the input signal being applied to each control circuit to determine which of the control circuit switches is closed to enable current to flow thereto from the second source.

Preferably each control circuit comprises two transistors, a control transistor and a switch transistor. The second constant current source may be connected to the switch transistors by respective light emitting diodes.

The current flow from the second constant current source through the switch transistors may be sensed to drive further display means.

Preferably means are provided for controlling the brightness of the display means in dependance upon ambient light intensity.

Embodiments of the present invention will now be described, by way of example, with reference to the accompanying drawings, in which:

FIG. 4a is a truth table indicative of circuit operation;

Figure 1:
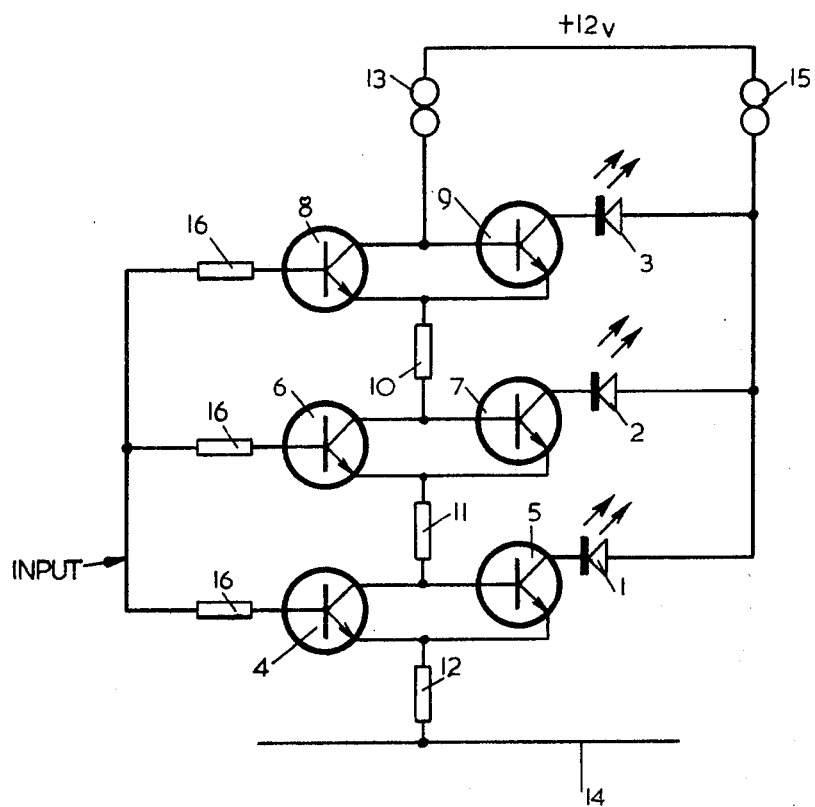
FIG. 1 is a circuit diagram of an embodiment of the invention comprising three light emitting diodes.

Referring to FIG. 1, a meter is shown which comprises three light emitting diodes (L.E.D.'s) 1,2,3 controlled respectively by transistor pairs 4 and 5, 6 and 7 and 8 and 9. The transistor pairs are connected in series by resitors 10, 11 and 12 between a first constant current supply 13 providing a 1 mA current flow and earth rail 14. A second constant current source 15 providing a 10 mA current flow is connected to the L.E.D.'s 1, 2 and 3. D.C. analogue input signals are applied to transistors, 4, 6 and 8 via resistors 16. The circuit may be described as a column of transistor pairs, although the transistor pairs neeed not be actually arranged in columns in space.

The circuit shown provides a total of five states corresponding to five different input voltage ranges. These states are, in order of increasing input voltage ranges:

1. Transistors 5, 7 and 9 are on, and L.E.D. 1 is energized. L.E.D.'s 2 and 3 are not energized as the voltage drop across them is insufficient due to the voltage drop across the base-emitter junction of transistor 5.

2. Transistors 4, 5, 7 and 9 are on, and L.E.D.'s 1 and 2 are energized. The L.E.D.'s share the 10 mA supply and are then not fully illuminated, although the total illumination corresponds to full illumination of one L.E.D.

3. Transistors 4, 7 and 9 are on an L.E.D. 2 is illuminated.

4. Transistors 4, 6, 7 and 9 are on, and L.E.D.'s. 2 and 3 are illiminated.

5. Transistors 4, 6 and 9 are on and L.E.D. 3 is illuminated.

States 2 and 4 provide "half digit" resolution. The use of a constant current supply results in the illumination of the L.E.D.'s being effected with a smooth transition rather than in an on/off manner. The physical effect of this smooth form of transition enables a satisfactory display to be provided with a much lower number of L.E.D.'s than in an arrangement employing a clocked display with abrupt changes of illumination from one L.E.D. to another.

Figure 2:
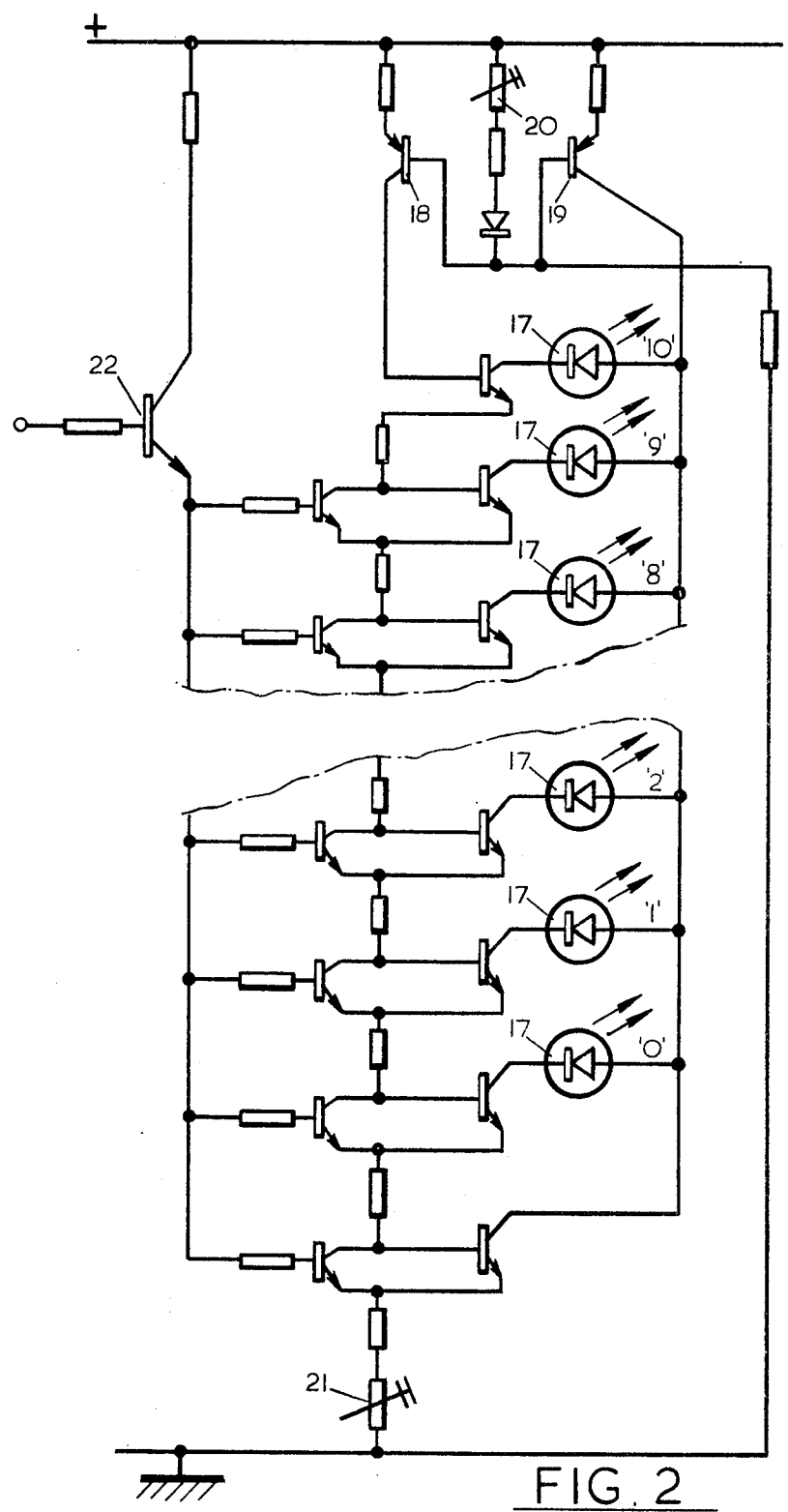
FIG. 2 is a diagram of a complete meter circuit embodying features described with reference to FIG. 1.

In a practical embodiment of the illustrated circuit in which resistors 10 and 11 had values of 50 ohms, resistor 12 had a value of 100 ohms, and the transistors had base-emitter and collector-emitter (saturated) voltages 0.6 V and 0.1 V respectively, the states 5, 3 and 1 correspond to input voltages of 2.35 V, 1.7 V and less than 1.1 V respectively FIG. 2 illustrates a meter circuit comprising 11 L.E.D.'s 17, only six of which are shown to simplify the Figure. The L.E.D.'s 17 are controlled in a manner which will be apparent from the foregoing description of FIG. 1. A first constant current is provided by a transistor 18. The L.E.D.'s 17 are powered by a second constant current of 20 mA provided by a transistor 19 and in operation the energized L.E.D.'s consume the greater proportion of this current to the extent of about 80% of the total current consumed by the entire circuit. The full scale deflection and zero input level may be adjusted by variable resistors 20 and 21 respectively. Input voltages are applied to the transistor 22.

The differential sensitivity of each of the digits 0, 1 . . . 9 and 10 can be controlled by appropriate selection of the resistors linking the transistor pairs. As shown in FIG. 2 these resistors may all have the same value to provide a linear response, or may have different values to provide a non-linear response to read for example decibels with a resolution of 0.5 dB, or any other non linear function, say for feedback control in servo systems.

As each of the L.E.D.'s requires two NPN transistos, suitable arrays of transistors, for example RCA CA 3086 arrays, may be used to reduce the number and cost of the active elements in the circuit. Alternatively, an integrated circuit could be constructed embodying the transistor pairs and the two constant current sources. It will be noted that the provision of a transistor pair (lowermost in FIG. 2) not associated with an L.E.D. results in none of the L.E.D.'s being energized at low input voltage. This contrasts with the arrangement of FIG. 1. It will also be appreciated that as the uppermost L.E.D. in FIG. 2 is connected to a single transistor rather than a transistor pair, the uppermost L.E.D. will remain energized even if the input voltage applied to transistor 22 exceeds the sensitivity range of the meter.

Figure 3:
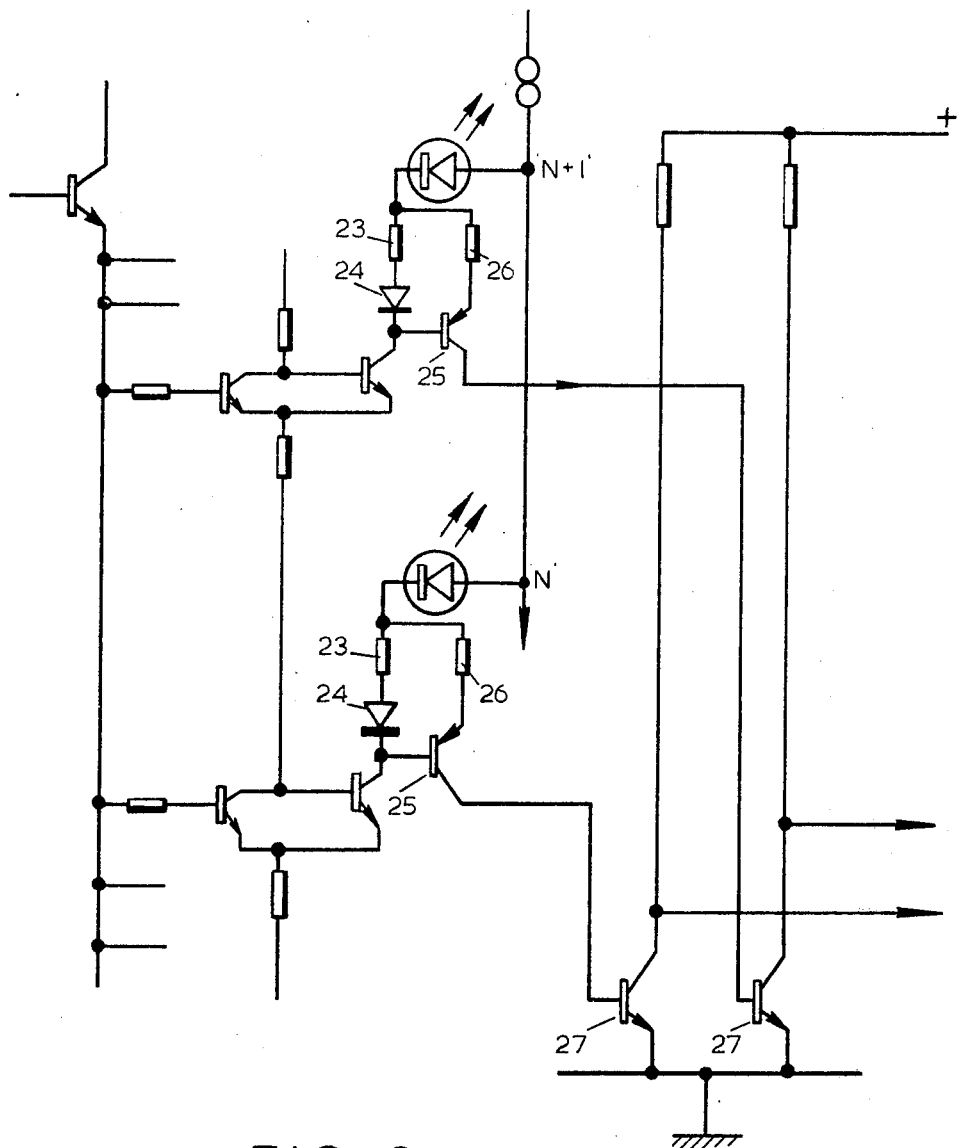
FIG. 3 is a diagram of portions of a circuit for driving display elements with signals derived from the second constant current flowing through the switch transistors arranged as shown in FIGS. 1 and 2.

Referring to FIG. 3, a fragment of a meter circuit is shown which has digital outlets for use for example in systems which require level limit warnings or as mentioned above feed back information for servo systems. Only two outputs and associated transistor pairs are shown to simplify the drawing, but it will be appreciated that these components form part of a larger circuit, for example a circuit such as is shown in FIG. 2.

A resistor 23 and a diode 24 are connected in series between the second constant current supply and the switch transistor of the associated transistor pair. The resistors 23 and diode 24 sense the current through the switch transistor of the associated transistor pair and develop a voltage which switches a transistor 25. A resistor 26 in series with transistor 25 limits the transistor current to prevent overloading of the constant current source which could disturb the switching of the chain of L.E.D.'s. The collector current of transistor 25 is utilized to switch a respective logic driver transistor 27.

Figure 4:
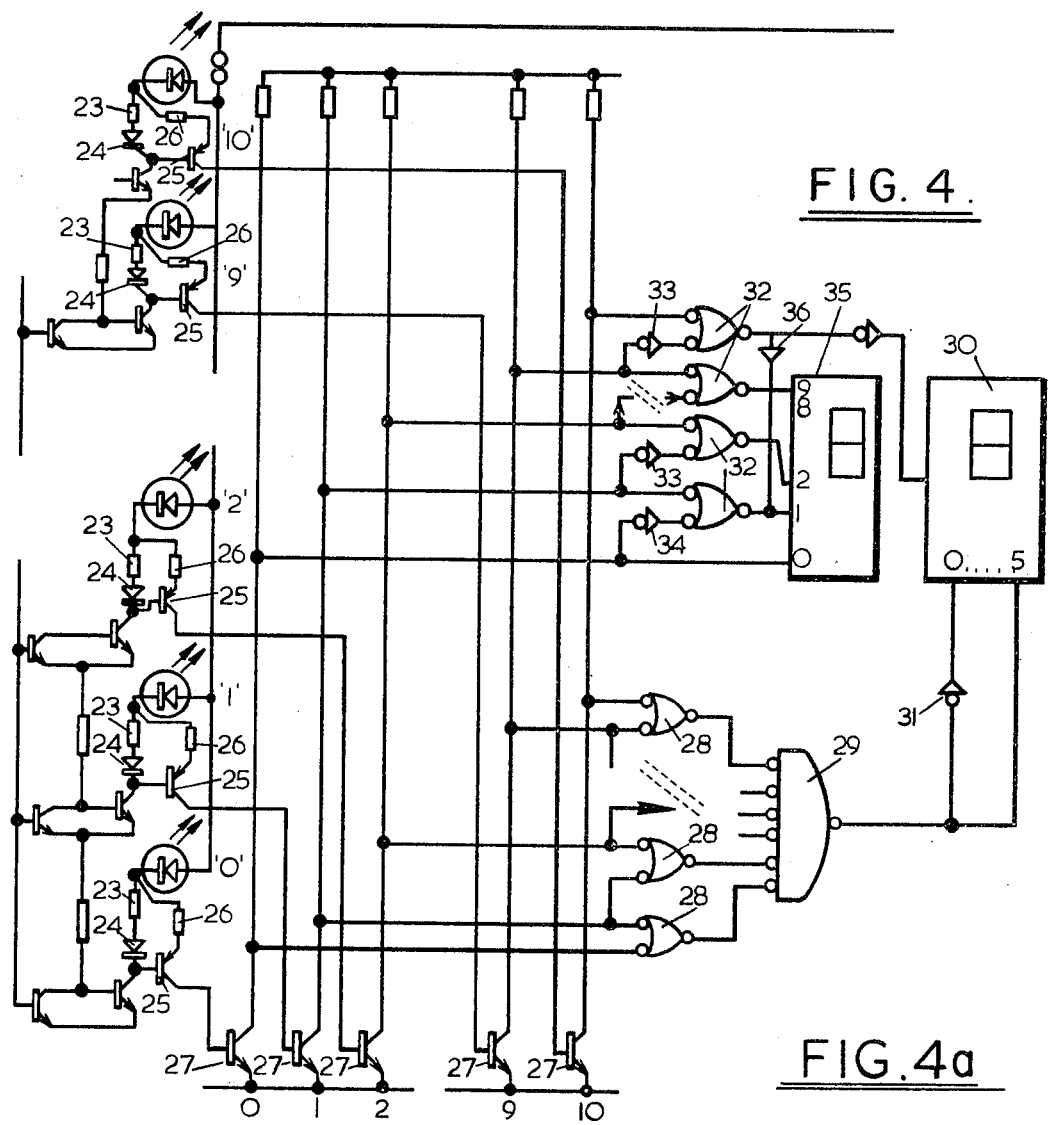
FIG. 4 is a diagram showing display elements arranged to be driven by circuitry such as is shown in FIG. 3.

Referring to FIG. 4, a circuit is shown in which the transistors 27 drive two digit display devices. The digit display devices require a zero voltage to drive them on and therefore negative logic is used. There are a total of 11 L.E.D.'s and 11 transistors 27. The collectors of the transistors 27 associated with the first and last L.E.D.'s in the L.E.D. array are connected to inputs of the first and last gates respectively of an array of 10 AND gates 28 only three of which are shown. The collectors of the nine intermediate transistors 27 are each connected to inputs of a respective two adjacent gates 28. The gates 28 are connected by an OR gate 29 to the 0 and 5 terminals of a digit display 30, the connection to the 0 terminal being via an inverter 31. The arrangement is such that when any two adjacent L.E.D.'s in the L.E.D. array are simultaneously energized, the device 30 displays 5. When only one L.E.D. is energized, the deivce 30 displays 0.

The collectors of the nine intermediate transistors 27 are also connected directly to the first nine of a further array of 10 AND gates 32 (only four of which are shown) and via inverters 33 to the last nine of the array of gates 32. The collector of the first transistor 27 is connected via an inverter 34 to the first of the gates 32 and directly to the 0 of a display device 35. The collector of the last transistor 27 is connected to the last of the gates 32. The outputs of the first nine gates 32 are connected to the 1 to 9 terminals of device 35 respectively and the last of the gates 32 is connected to a "decimal point" terminal of device 30 and via a buffer 36 to the 1 terminal of device 35. The arrangement is such that the device 35 displays the digits 0 to 9 one at a time, the simultaneous display of two digits when two of the L.E.D.'s are energized at the same time being inhibited by the inverted inputs to gates32. The last gate 32 is arranged to cause the display of the digit 1 in device 35 and to prevent display of the decimal point in device 30.

FIG. 4 includes a truth table illustrating the operation of the circuitry.

It will be appreciated that the present invention may be applied to limit bridges, servo mechanisms, etc., that is any application which requires digital read out and/or digital information outlets. The use of the moving dot display is applicable where changes in level are to be observed such as in peaking a frequency selective receiver or in servo systems where engine revolutions are to be indicated.

The L.E.D.'s of the embodiment described with reference to FIG. 2 are driven by a constant current of 20 mA to give a bright display suitable for outdoor use. For indoor use however the brightness of the display may be reduced. This may be achieved by reducing the L.E.D.'s current consumption, thereby increasing the L.E.D.'s life span and reducing power consumption. A reduction in the power consumption can be significant in the case of portable battery-powered equipment.

Figure 5:
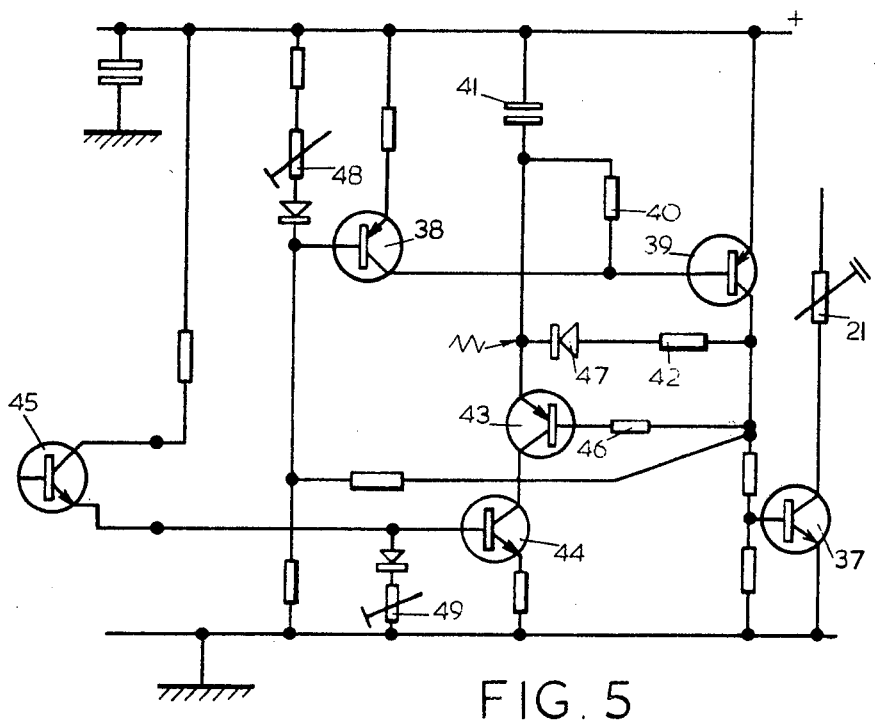
FIG. 5 is a circuit diagram of means for controlling the brightness of the display provided by the circuit of FIG. 2.

The brightness of the L.E.D. display may be controlled in dependence upon the ambient light intensity by the circuit illustrated in FIG. 5. Referring to FIG. 5, the illustrated control circuit comprises a transistor 37 the collector of which is connected to the variable resistor 21 (see FIG. 2). Current which energizes the L.E.D.'s 17 (FIG. 2) must pass through both the resistor 21 and the transistor 37, and thus the transistor 37 can be used to control the brightness of the L.E.D. display. The transistor 37 is arranged to be cyclically switched ON an OFF by an astable multivibrator formed by transistors 38 and 39 connected as a Schmitt trigger with input at the junction of resistor 40 and capacitor 41. The OFF/ON switching voltages at the said junction are approximately +8V and +10.5V, and occur in the form of a sawtooth waveform the timing of which is controlled by capacitor 41 and independent mark and space charging and discharging circuits. The mark time is determined by a discharge resistor 42 alone to be 1.5 msec. The space time is controlled by charging current through transistors 43 and 44. The current amplitude depends on ambient light affecting a light sensitive transistor 45. The greater the intensity of the ambient light, the larger the charging current and the shorter the space time. The 'Dark' space charging current, that is when transistor 44 is cut off, is determined by a resistor 46 to be 13.5 mSec.

During the mark time, when transistor 39 is on, a diode 47 is conductive and transistor 43 is off. During the space time, when transistor 39 is off, diode 47 is off and transistor 43 is on. Thus the mark and space times are independently controlled.

A variable resistor 48 controls the D.C. voltages at which the ON/OFF switching ocurs, thus controlling the Dark mark to space ratio.

A variable resistor 49 controls the D.C. gain of the transistor 44, thus controlling the 'Bright' mark to space ratio.

The astable multivibrator current consumption is 0.4 mA at 10% duty cycle and 2 mA at 95% duty cycle. The total meter circuit consumes only 2.6 to 3.3 mA at10% duty cycle, and 23 to 27 mA at 95% duty cycle.

The lowest frequency of the astable may be chosen to be for example 66 Hz to avoid flicker effect. The cycle length is 15 mSec, therefore the maximum mark time of 10% duty cycle is 1.5 mSec.

Figure 6:
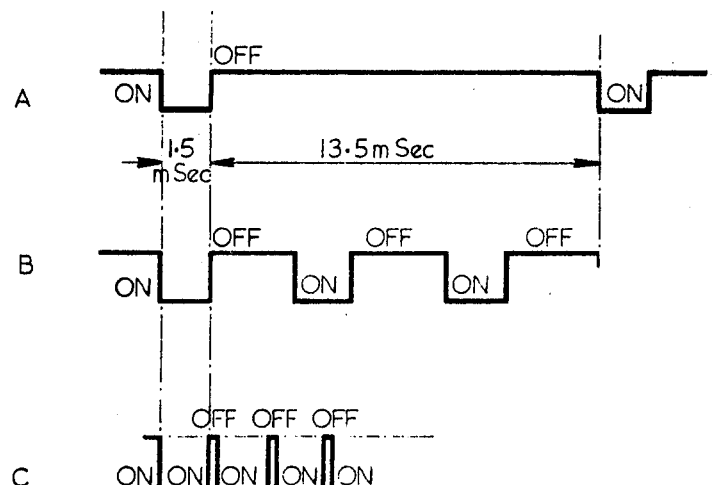
FIG. 6 shows waveforms appearing in the circuit of FIG. 5.

FIGS. 6A, B and C show waveforms appearing at the collector of transistor 37 in dark (10% ON), hazy and bright (95% ON) conditions respectively.

What is claimed is:

1. A meter for presenting a digital display representative of an analogue input signal, the meter comprising a first constant current source, a plurality of series connected control circuits each comprising a switch arranged to draw current from said first source, a second constant current source connected to a respective switch in each control circuit so that only when the switch is closed a current may flow from the second source to a respective control circuit, individual display means for indicating each control circuit when a predetermined current flows from the second source, and an input signal circuit providing said analogue signal to each control circuit to close not more than two adjacent ones of the control circuit switches in said series to enable current to flow thereinto from the second source thereby to operate not more than two adjacent ones of said individual display means.

2. A meter according to claim 1, wherein each control circuit comprises a control transistor to which the input signal is applied and each switch comprises a switch transistor.

3. A meter according to claim 2, wherein the second constant source is connected to the switch transistors by respective light emitting diodes which thereby comprise said individual display means.

4. A meter according to claim 2, comprising further adisplay means responsive to current flow from the second constant current source through the switch transistors.

5. A meter according to claim 4, including current responsive means comprisng a diode and a resistor connected in series betwen the second constant current source and a respective switch transistor, and a further transistor arranged to be controlled by the voltage developed across the resistor and diode coupled to actuate said futher display means.

6. A meter according to claim 5, wherein the said further transistor controls a respective driver transistor comprising coupling means with said display means.

7. A meter according to claim 6, wherein the further display means comprises one or more digit display devices connected to the driver transistors by gate circuitry.

8. A meter according to claim 7, comprising said digital display and said further display means having a set of AND gates, wherein each driver transistor is connected to a respective AND gate, and each AND gate receives an input directly from a pair of driver transistors an inverter connected to one said AND gate input and a further display connected to each AND gate output, and a still further digit display device being connected to an OR gate which receives inputs from each of a plurality of a further set of AND gates each of which receives inputs from one of said respective pairs of the driver transistors, the pairs of driver transistors which provide inputs to the AND gates being associated with adjacent ones of the series connected control circuits.

9. A meter according to claim 1, comprising means for controlling the brightness of the display means in dependence upon ambient light intensity.

10. A meter according to claim 9, wherein the brightness control means comprises a switch arranged so that current from the second constant current source passes therethrough, and means for cyclically turning the switch ON and OFF.

11. A meter according to claim 10, wherein the switch comprises a transistor controlled by an astable circuit.

* * * * *